(12) United States Patent
Majumdar et al.

(10) Patent No.: US 10,756,711 B1
(45) Date of Patent: Aug. 25, 2020

(54) INTEGRATED CIRCUIT SKEW DETERMINATION

(71) Applicant: XILINX, INC., San Jose, CA (US)

(72) Inventors: Amitava Majumdar, San Jose, CA (US); Nui Chong, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/682,835

(22) Filed: Nov. 13, 2019

(51) Int. Cl.
*H03K 3/03* (2006.01)
*H03K 3/017* (2006.01)
*H03K 3/011* (2006.01)

(52) U.S. Cl.
CPC ........... *H03K 3/0315* (2013.01); *H03K 3/011* (2013.01); *H03K 3/017* (2013.01)

(58) Field of Classification Search
CPC ..................................................... H03K 3/0315
USPC ....................................................... 331/57, 45
See application file for complete search history.

(56) References Cited

U.S. PATENT DOCUMENTS

| | | | | |
|---|---|---|---|---|
| 2003/0030473 | A1* | 2/2003 | Lee | H03L 7/0818 327/158 |
| 2003/0214335 | A1* | 11/2003 | Saeki | H04L 7/0337 327/165 |
| 2020/0127647 | A1* | 4/2020 | Li | H03K 5/131 |

OTHER PUBLICATIONS

Cheng, Da, et al., "Field Profiling & Monitoring of Payload Transistors in FPGAs", Xilinx, Inc., IEEE 2017 23rd Internartional Symposium on On-Line Testing and Robust Systems Design (IOLTS) p. 180-185, Dec. 2017.

* cited by examiner

*Primary Examiner* — Joseph Chang
(74) *Attorney, Agent, or Firm* — Patteron + Sheridan, LLP (57) ABSTRACT

Examples described herein provide determining skew of transistors on an integrated circuit. In an example, an integrated circuit includes a ring oscillator and first and second detector circuits. The ring oscillator includes serially connected buffers. Each buffer includes serially connected inverters that include transistors. A transistor of each buffer has a different strength of another transistor of the respective buffer. The first and second detector circuits are connected to different first and second tap nodes, respectively, along the serially connected buffers. The first detector circuit is configured to count a number of cycles of a reference clock that a cyclic signal on the first tap node is either a logically high or low level. The second detector circuit is configured to count a number of cycles of the reference clock that a cyclic signal on the second tap node is either a logically high or low level.

20 Claims, 5 Drawing Sheets

INTEGRATED CIRCUIT SKEW DETERMINATION

TECHNICAL FIELD

Examples of the present disclosure generally relate to determining skew in an integrated circuit and, in particular, to determine skew in an integrated circuit using a ring oscillator.

BACKGROUND

Wafers on which integrated circuits are formed are commonly measured to determine the skew of the manufacturing process used to form the integrated circuits. The skew can affect the ability of the integrated circuits to operate at speeds, temperatures, and voltages at which the integrated circuits were designed to operate. The skew can be characterized by a process corner. In one naming convention, three corners exist: typical (T), fast (F), and slow (S). Fast and slow corners exhibit carrier mobilities that are higher and lower than normal, respectively. Process skew can result from, for example, source/drain epitaxial growth, dopant implantations for wells, channels, and source/drains, gate sidewall spacer width, gate dielectric (e.g., oxide) processing, and gate work-function tuning metal layer thicknesses. In this convention, two-letter designations are used, where the first letter refers to the n-type transistor corner and the second letter refers to the p-type transistor corner. This characterization can be relevant to the use of the integrated circuit and/or the environment in which the integrated circuit is capable of operating.

SUMMARY

Examples described herein provide determining skew of transistors on an integrated circuit. Some examples described herein provide a sensor circuit that is capable of being implemented to determine skew (e.g., process skew) of transistors on a die and/or wafer. Some examples can detect skew during operation of a circuit so that direct current (DC) and alternating current (AC) characteristics of a circuit can be considered when detecting skew. Some examples can implement one or more sensor circuits in field on a die such that circuitry or logic can be implemented to recalibrate other circuits that result from changing conditions of the die that can cause cyclic signals to vary.

An example of the present disclosure is an integrated circuit. The integrated circuit includes a ring oscillator, a first detector circuit, and a second detector circuit. The ring oscillator includes serially connected buffers. Each of the buffers includes at least two serially connected inverters include transistors. One or more of the transistors of each of the buffers has a different strength of another one or more of the transistors of the respective buffer. The first detector circuit is connected to a first tap node along the serially connected buffers. The first detector circuit includes a first counter and first logic. The first detector circuit is configured to count a first number of cycles of a reference clock that a first cyclic signal on the first tap node is either a logically high level or a logically low level. The second detector circuit is connected to a second tap node along the serially connected buffers. The second tap node is different from the first tap node. The second detector circuit includes a second counter and second logic. The second detector circuit is configured to count a second number of cycles of the reference clock that a second cyclic signal on the second tap node is either a logically high level or a logically low level.

Another example of the present disclosure is a method for determining skew of an integrated circuit. A first number of cycles of a reference clock that a first cyclic signal on a first tap node is either a logically high level or a logically low level is counted by a first detector circuit. The first tap node is along serially connected buffers of a ring oscillator. Each of the buffers includes at least two serially connected inverters comprising transistors. One or more of the transistors of each of the buffers has a different strength of another one or more of the transistors of the respective buffer. A second number of cycles of the reference clock that a second cyclic signal on a second tap node is either a logically high level or a logically low level is counted by a second detector circuit. The second tap node is along the serially connected buffers and is different from the first tap node. A gradient between the first tap node and the second tap node is determined, by a controller, based on the first number of cycles and the second number of cycles.

Another example of the present disclosure is an integrated circuit. The integrated circuit includes a ring oscillator, a first detector circuit, and a second detector circuit. The ring oscillator includes serially connected buffers. Each of the buffers includes a first inverter and a second inverter. The first inverter includes a first p-type transistor and a first n-type transistor. An input node of the first inverter is an input node of the respective buffer. The second inverter includes a second p-type transistor and a second n-type transistor. An input node of the second inverter is connected to an output node of the first inverter. An output node of the second inverter is an output node of the respective buffer. A strength of at least one of the first p-type transistor, the second p-type transistor, the first n-type transistor, and the second n-type transistor is greater than a strength of another at least one of the first p-type transistor, the second p-type transistor, the first n-type transistor, and the second n-type transistor. The first detector circuit is connected to a first tap node along the serially connected buffers. The first detector circuit includes a first counter and first logic that collectively is configured to count a first number of cycles of a reference clock that a first cyclic signal on the first tap node is either a logically high level or a logically low level. The second detector circuit is connected to a second tap node along the serially connected buffers. The second tap node is different from the first tap node. The second detector circuit includes a second counter and second logic that collectively is configured to count a second number of cycles of the reference clock that a second cyclic signal on the second tap node is either a logically high level or a logically low level.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Examples described herein provide determining skew of transistor strengths on an integrated circuit. Skew in this context refers to a departure of a drive strength of one or more transistor from a designed or nominal value. Some examples described herein provide a sensor circuit that is capable of being implemented to determine skew (e.g., process skew) of transistors on a die and/or wafer. The sensor circuit can include a ring oscillator that includes n number of serially connected buffers and an inverter connected as feedback of the serially connected buffers. Each of the buffers can include two (or an integer multiple of two) serially connected inverters. A strength of one or more of the transistors of each of the buffers is different from a strength of another one or more of the transistors of the respective buffer. Skew can be determined by determining at least one of frequency and period of a cyclic signal generated by the ring oscillator and by determining a high period gradient (or a duty cycle gradient) between cyclic signals on different tap nodes of the ring oscillator. In some examples, the sensor circuit can be implemented in field of an integrated circuit on a die to more accurately detect skew. In some examples, the sensor circuit can be implemented in a scribe line of a wafer for detecting process skew of dies on the wafer.

Generally, process skew for a die has been a single determination made at the time of manufacturing the die. Further, the process skew was determined based on direct current (DC) characteristics of test structures. Also, the process skew was determined from test structures in a scribe line of a wafer from which the die was manufactured. This process skew determination does not permit dynamic recalibration of process skew subsequent to manufacturing and does not consider alternating current (AC) characteristics of a circuit. Some examples can overcome these deficiencies. For example, the sensor circuit that includes a ring oscillator may be used to detect skew during operation of the ring oscillator (e.g., at a high frequency) so that DC and AC characteristics of a circuit can be considered. Some examples can implement one or more sensor circuits in field on a die such that circuitry or logic (e.g., a controller) can be implemented to recalibrate other circuits (e.g., clock tree networks, intellectual property (IP) blocks like a double data rate (DDR) memory controller, etc.) that are affected by cyclic signals varying due to changing conditions of the die. For example, time-dependent degradation can cause a frequency and/or duty cycle of a cyclic signal to change over time, and the sensor circuit can be used to determine how to recalibrate circuits to accommodate a change of the cyclic signal. The transistors used in the sensor circuit (e.g., in the ring oscillator) can be or include thin-oxide transistors that are standard threshold voltage (SVT) or low threshold voltage (LVT). Other uses and benefits may become apparent to a person having ordinary skill in the art upon consideration of the following description.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Figure 1:
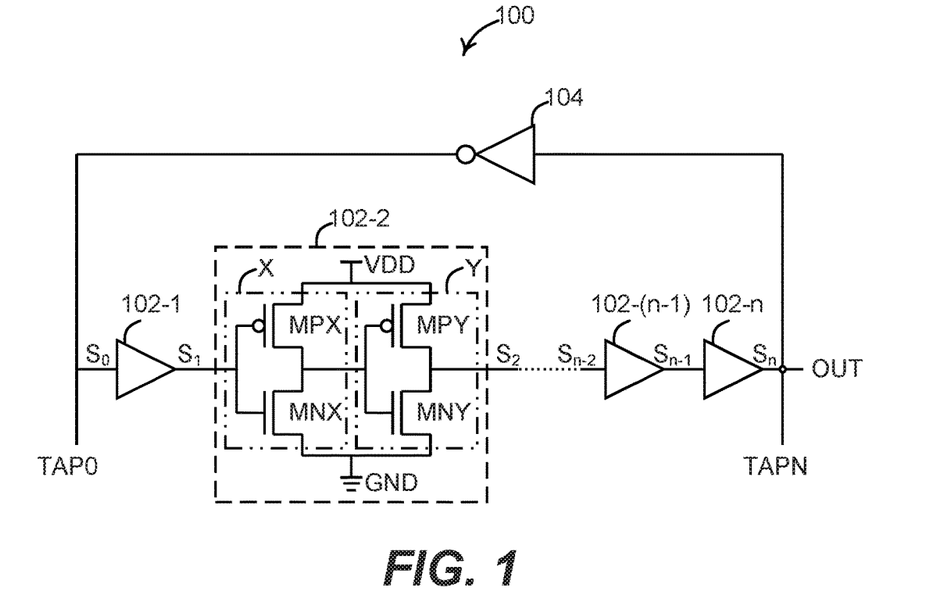
FIG. 1 is a circuit schematic of a ring oscillator that can be implemented in a sensor circuit according to some examples.

FIG. 1 is a circuit schematic of a ring oscillator 100 that can be implemented in a sensor circuit according to some examples. The ring oscillator 100 includes n number of buffers 102-1, 102-2, . . . 102-($n$−1), 102-$n$ (individually or collectively, buffer(s) 102) that are serially connected. Any number of buffers 102 may be included in the serially connected buffers 102. The ring oscillator 100 further includes an inverter 104 connected as feedback to the serially connected buffers 102.

More specifically, an output node of each buffer 102-1 through 102-($n$−1) is connected to an input node of the next successive buffer 102-2 through 102-$n$, respectively. An output node of the buffer 102-$n$ is connected to an input node of the inverter 104 and is an output node OUT of the ring oscillator 100. An output node of the inverter 104 is connected to an input node of the buffer 102-1. The input node of the buffer 102-1 is further connected to a tap 0 node TAP0, and the output node of the buffer 102-$n$ is further connected to a tap n node TAPN. Any input and/or output node of the serially connected buffers 102 can be connected to a respective tap node. Respective signals $S_0$, $S_1$, $S_2$, . . . $S_{n-2}$, $S_{n-1}$, $S_n$ are transmitted on nodes 0, 1, 2, . . . n−2, n−1, n, respectively, of the serially connected buffers 102. Signal $S_0$ is transmitted on node 0 (e.g., the input node of the buffer 102-1), and signal $S_1$ is transmitted on node 1 (e.g., the output and input nodes of the buffers 102-1, 102-2, respectively). A person having ordinary skill in the art will readily understand on which nodes the signals $S_2$, . . . $S_{n-2}$, $S_{n-1}$ are transmitted. The signal $S_n$ is transmitted on node n (e.g., the output node of the buffer 102-$n$), which is further transmitted on the output node OUT of the ring oscillator 100 as the output signal from the ring oscillator 100. The output node OUT can be an output node of any buffer 102. The ring oscillator 100 is capable of outputting an output signal (e.g., on the output node OUT) that has a frequency F and a period P. The frequency F is equal to the inverse of the period P (e.g., F=1/P). The frequency F and period P can be observed at any node in the ring oscillator 100.

In the illustrated example, each of the buffers 102 has generally a same circuit. As illustrated, buffer 102-2 includes serially connected inverters X, Y. An input node of the inverter X is the input node of the buffer 102-2. An output node of the inverter X is connected to an input node of the inverter Y. An output node of the inverter Y is the output node of the buffer 102-2. The inverter X includes a p-type transistor MPX and an n-type transistor MNX. Gates of the transistors MPX, MNX are connected together and are the input node of the inverter X. A source of the p-type transistor MPX is connected to a power source node VDD, and a drain of the p-type transistor MPX is connected to a drain of the n-type transistor MNX, which forms, at least in part, the output node of the inverter X. A source of the n-type transistor MNX is connected to a ground node GND. The inverter Y includes a p-type transistor MPY and an n-type transistor MNY. Gates of the transistors MPY, MNY are connected together and to the output node of the inverter X. A source of the p-type transistor MPY is connected to the power source node VDD, and a drain of the p-type transistor MPY is connected to a drain of the n-type transistor MNY, which forms, at least in part, the output node of the inverter Y. A source of the n-type transistor MNY is connected to the ground node GND.

The circuit of the buffer 102-2 as illustrated in FIG. 1 is replicated in each of the buffers 102. In the illustrated example, the circuit of each of the buffers 102 is designed to be the same and have the same electrical characteristics. For example, doping, channel width, channel length, etc. of the transistor MPX is designed to be the same in each of the buffers 102. Similarly, the transistor MNX is designed to be the same in each of the buffers 102; the transistor MPY is designed to be the same in each of the buffers 102; and the transistor MNY is designed to be the same in each of the buffers 102. Accordingly, the electrical characteristics of the transistors MPX in the buffers 102 are designed to be the same; the electrical characteristics of the transistors MNX in the buffers 102 are designed to be the same; the electrical characteristics of the transistors MPY in the buffers 102 are designed to be the same; and the electrical characteristics of the transistors MPY in the buffers 102 are designed to be the same.

Skew between p-type transistors and n-type transistors of the ring oscillator 100 can be characterized as strengths $S_p$, $S_n$, respectively. The strengths $S_p$, $S_n$ can be generally composites of electrical characteristics of p-type or n-type transistors, respectively, such as saturation drive current $I_{Dsat}$, leakage current $I_{lkg}$, threshold voltage $V_t$, etc. A person having ordinary skill in the art that physical characteristics of transistors affect these electrical characteristics. Example physical characteristics include channel width, channel length, source/drain doping concentration, channel doping concentration, gate dielectric thickness, gate dielectric material, gate conductor material, etc. Each strength $S_p$, $S_n$ can take one of a number of generalized characterizations. For example, each strength $S_p$, $S_n$, can be characterized as fast (F), typical (T), and slow (S), such that each die, wafer, and/or lot can be characterized by such strengths. As an example, a die characterized as "FF" is one where both n-type and p-type transistors (in the aggregate) are fast, or a die characterized as "TS" is one where n-type transistors (in the aggregate) are typical (or nominal) and p-type transistors (in the aggregate) are slow. Some examples described herein can determine a frequency F and/or period P and can determine a high period gradient HPG(j) and/or duty cycle gradient DCG(j), and based upon these determinations can characterize strengths $S_p$, $S_n$.

A rise-time of a signal propagated through p-type transistor(s) can serve as a proxy for the strength $S_p$ of the p-type transistors local to the ring oscillator 100, and a fall-time of a signal propagated through n-type transistor(s) can serve as a proxy for the strength $S_n$ of the n-type transistors local to the ring oscillator 100. The analysis below explains generalizations that relate such rise and fall-times to the ring oscillator 100 and then to the strengths $S_p$, $S_n$. Certain generalizations and assumptions are taken for these proxy relationships. During manufacturing a die, certain variations may occur. A systematic process variation can be a process system-wide variation from a recipe of the process and can generally affect, e.g., each transistor subjected to that process the same. Intra-process variation can be a variation of a process between locations subjected to that process and can affect, e.g., each transistor subjected to that process differently. Stated differently, a systematic process variation changes a distribution of results of a process (e.g., a random variable), and intra-process variation is variation drawn from a given distribution of results of a process.

As an example, assume transistors M1, M2, M3 are subjected to a same doping process. The tool used to dope the transistors M1, M2, M3 may be incorrectly calibrated such that the dosing of dopants for the transistors M1, M2, M3 varies from the dosing indicated by the recipe. This incorrect calibration can cause a systematic process variation (e.g., changes the distribution of doping by systematically increasing or decreasing doping by some amount). Further, the doping process can be a random process in that dopants injected into a substrate can have injection paths that are subject to randomness, such that the doping of each transistor M1, M2, M3 becomes a random variable. Variation of the doping of the transistors M1, M2, M3 between each other can be intra-process variation (e.g., doping at any location is drawn from a same distribution of the doping process).

Due to intra-process variation usually being a random variable, it is assumed that, in the aggregate, intra-process variation does not generally affect the operation of the ring oscillator 100. Generally, intra-process variation at locations of the various transistors can tend to average out to the mean of the distribution of the intra-process variation. Accordingly, changes in rise-times and fall-times of a signal propagated through the ring oscillator 100 due to intra-process variation may be disregarded during the below-described analysis. Further, it is assumed that, in the aggregate, systematic process variation is the primary cause of differences between designed operation of the ring oscillator 100 and realized operation of the ring oscillator 100, and hence, changes in the rise-times and fall-times of a signal propagated through the ring oscillator 100 from the designed rise-time and fall-time are assumed to be primarily affected by systematic process variation, which is analyzed in more detail subsequently.

Based on these assumptions, when the buffers 102 are designed to have the same characteristics, the buffers 102 can be treated and analyzed as having the same characteristics even if some variation between the buffers 102 is realized on the die, and any variation of the operation of the buffers 102 from the designed operation is assumed to be the result of systematic process variation that affects each buffer 102 the same.

In the illustrated buffer 102, a fall-time of any signal propagated through any inverter X, Y is associated with the strength $S_n$ of n-type transistors, and a rise-time of any signal propagated through any inverter X, Y is associated with the strength $S_p$ of p-type transistors. In an inverter, an output signal falls from high to low by an n-type transistor turning on, as a function of an input signal, to pull the output signal to ground, and hence, the fall-time depends on the strength $S_n$ of the n-type transistor to pull the signal to ground. In the below analysis, fall-time $X_f$ is associated with the n-type transistor MNX of inverter X, and fall-time $Y_f$ is associated with the n-type transistor MNY of inverter Y. Similarly, an output signal rises from low to high by a p-type transistor turning on, as a function of an input signal, to pull the output signal to the power source, and hence, the rise-time depends on the strength $S_p$ of the p-type transistor to pull the signal to the power source. In the below analysis, rise-time $X_r$ is associated with the p-type transistor MPX of inverter X, and rise-time $Y_r$ is associated with the p-type transistor MPY of inverter Y.

The rise-time $T_r$ and fall-time $T_f$ of a buffer 102 can be generalized as a function of rise and fall-times $X_r$, $Y_r$, $X_f$, $Y_f$ of the inverters X, Y in the buffer 102. The rise-time $T_r$ of the buffer 102 is a function of the fall-time $X_f$ of the inverter X plus the rise-time $Y_r$ of the inverter Y (e.g., $T_r = X_f + Y_r$). For a signal input to a buffer 102 transitioning from low to high (e.g., rising) to be output by the buffer 102, the signal is propagated through the inverter X to be falling before being propagated through the inverter Y to be rising. Accordingly, the fall-time $X_f$ of the inverter X and the rise-time $Y_r$ of the inverter Y affect the rise-time $T_r$ of the buffer 102. Similarly, the fall-time $T_f$ of the buffer 102 is a function of the rise-time $X_r$ of the inverter X plus the fall-time $Y_f$ of the inverter Y (e.g., $T_f = X_r + Y_f$). The inverter 104 also has a rise-time $Z_r$ and a fall-time $Z_f$.

The period P of the signal output by the ring oscillator 100 can be generalized as the cumulative rise-times and fall-times of the buffers 102 and inverter 104. Equivalently, the frequency of the signal output by the ring oscillator 100 can be generalized as the inverse of the cumulative rise-times and fall-times of the buffers 102 and inverter 104. When the output signal transitions to low, the inverter 104 transitions its output signal to high, which is propagated through the buffers 102 such that the output signal of each buffer 102 transitions to high. Accordingly, the output signal of the ring oscillator 100 remains low for the cumulative time that the inverter 104 and buffers 102 take to transition respective output signals to high (e.g., rise-times $Z_r$, $T_r$ for inverter 104 and buffers 102, respectively). Similarly, when the output signal transitions to high, the inverter 104 transitions its output signal to low, which is propagated through the buffers 102 such that the output signal of each buffer 102 transitions to low. Accordingly, the output signal of the ring oscillator 100 remains high for the cumulative time that the inverter 104 and buffers 102 take to transition respective output signals to low (e.g., fall-times $Z_f$, $T_f$ for inverter 104 and buffers 102, respectively). With n number of buffers 102 each assumed to have equal rise-times $T_r$ and equal fall-times $T_f$, the period P and frequency F can generalized as follows:

$$P = n(T_r + T_f) + Z_r + Z_f = n(X_r + Y_r + X_f + Y_f) + Z_r + Z_f;$$

$$F = 1/P = 1/[n(X_r + Y_r + X_f + Y_f) + Z_r + Z_f].$$

A high period H is the time interval of a period P where a cyclic signal is high. A low period L is the time interval of a period P where a cyclic signal is low. A duty cycle D is a ratio of the high period H to the period P (e.g., $D = H/P$). A high period H and low period L can be dependent upon the location of the node in the ring oscillator 100 at which a cyclic signal is observed. Hence, high period $H_k$ and low period $L_k$ are the respective high period H and low period L observed at node k, where each node k transmits a signal $S_k$. For example, high period $H_0$ and low period $L_0$ are the respective high period H and low period L observed at the node 0 that transmits signal $S_0$ (e.g., the output node of inverter 104 and/or the input node of buffer 102-1); high period $H_1$ and low period $L_1$ are the respective high period H and low period L observed at the node 1 that transmits signal $S_1$ (e.g., the output node of buffer 102-1); and high period $H_n$ and low period $L_n$ are the respective high period H and low period L observed at the node n that transmits signal $S_n$ (e.g., the output node of buffer 102-n).

The high period $H_k$ observed at node k can be generalized as the cumulative rise-times $T_r$ of buffers 102 subsequent to node k in the serially connected buffers 102 and fall-times $Z_f$, $T_f$ of the inverter 104 and of buffers 102 in the serially connected buffers 102 preceding the node k. When a signal on node k transitions to high, that signal remains high until the transition from low to high is propagated through buffers 102 subsequent to the node k, the inverter 104 transitions its output signal from high to low, and the transition from high to low is propagated through buffers 102 preceding node k. With n number of buffers 102 each assumed to have equal rise-times $T_r$ and equal fall-times $T_f$, the high period $H_k$ observed at node k can generalized as follows:

$$H_k = (n-k)T_r + kT_f + Z_f = nT_r + k(T_f - T_r) + Z_f.$$

A high period gradient HPG(j) is a difference between the high period $H_k$ of a signal observed at node k and the high period $H_{k+j}$ of a signal observed at node k+j. The high period gradient HPG(j) may also be referred to as a j-order high period gradient. A duty cycle gradient DCG(j) can be equivalent to the high period gradient HPG(j) and can be a difference between duty cycles of respective signals observed at nodes k, k+j. The high period gradient HPG(j) and duty cycle gradient DCG(j) can be generalized as follows:

$$HPG(j) = H_{k+j} - H_k$$

$$= [nT_r + (k+j)(T_f - T_r) + Z_f] - [nT_r + k(T_f - T_r) + Z_f]$$

$$= j(T_f - T_r) = j[(X_r + Y_f) - (X_f + Y_r)]$$

$$= j[(X_r + Y_f) - (X_f + Y_r)] = j[(X_r - X_f) + (Y_f - Y_r)];$$

$$DCG(j) = D_{k+j} - D_k = (H_{k+j} - H_k)/P = HPG(j)/P$$

$$= j[(X_r - X_f) + (Y_f - Y_r)]/P.$$

As shown by the generalizations and equations above, the period P decreases/increases linearly with the n number of serially connected buffers 102 in the ring oscillator 100. Additionally, the high period $H_k$, where k=n, also decreases/increases linearly with the n number of serially connected buffers 102 in the ring oscillator 100. The high period $H_k$ observed at node k is dependent on the position of the node k in the serially connected buffers 102 relative to the position of the inverter 104 of the ring oscillator 100. The high period gradient HPG(j) and duty cycle gradient DCG(j) observed at positions j buffers apart are each independent of the position of the buffers 102 and are each a function of differences between the rise-time and fall-time of each inverter X, Y of the buffers 102.

If the inverters X, Y of the buffers 102 are identical, then the high period $H_k$ observed at node k becomes independent of the position of node k, as shown by the following:

$$X_r = Y_r \text{ and } X_f = Y_f, \text{which leads to } T_r = T_f;$$

$$H_k = nT_r + k(T_f - T_r) + Z_f = nT_r + Z_f.$$

Further, with the high period $H_k$ observed at node k being independent of the position of node k, the high period gradient HPG(j) and duty cycle gradient DCG(j) become zero regardless of the value of j. Accordingly, in some examples, the inverters X, Y of the buffers 102 are not identical, as will become apparent subsequently. Generally, a nominal strength of one or more of the transistors MPX, MNX, MPY, MNY is different from a nominal strength of another one or more of the transistors MPX, MNX, MPY, MNY, e.g., which results in one or more unequal nominal rise and fall-times $X_r$, $Y_r$, $X_f$, $Y_f$ so that the high period gradient HPG(j) and duty cycle gradient DCG(j) are nominally non-zero.

As indicated, the generalizations described herein are based on the assumption that the buffers 102 are implemented using the same circuit (including same transistor characteristics for corresponding transistors). For example, the buffers 102 can be implemented using a same standard design cell. The models and generalization can be modified to accommodate differing circuits for the buffers, which would be readily apparent to a person having ordinary skill in the art.

Some examples use at least one of a frequency F and/or period P and at least one of a high period gradient HPG(j) and/or duty cycle gradient DCG(j) to characterize strengths $S_p$, $S_n$ of p-type and n-type transistors in a circuit. Generally, the examples can characterize p-type and n-type transistors in the ring oscillator 100 and transistors within some distance of the ring oscillator 100. Transistors very near the ring oscillator 100 typically are subjected to near identical variation as the transistors of the ring oscillator 100 such that characterization of transistors of the ring oscillator 100 is also generally applicable to those transistors very near the ring oscillator 100. As a distance between transistors and the ring oscillator 100 increases, the characterization of transistors of the ring oscillator 100 may not be applicable for those other transistors.

Figure 2:
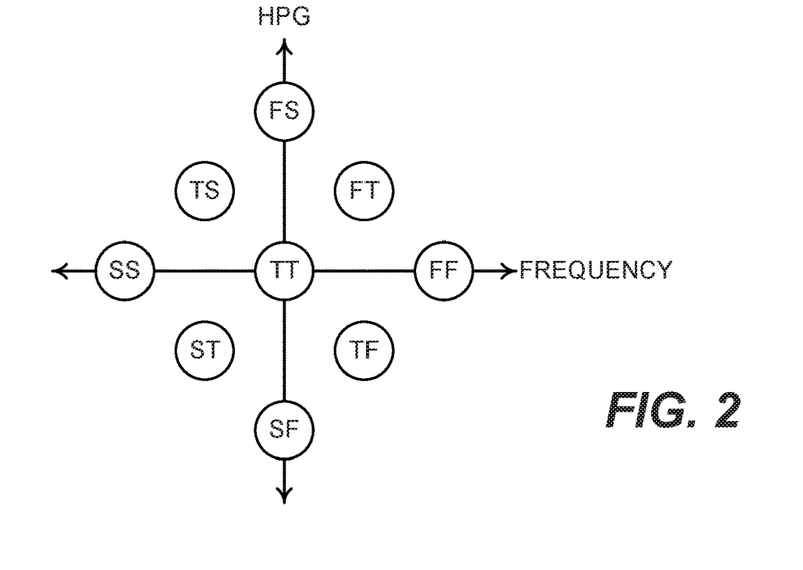
FIG. 2 is a generalized plot illustrating a relationship between frequency and high period gradient for characterizing integrated circuits according to some examples.

FIG. 2 is a generalized plot illustrating a relationship between frequency F and high period gradient HPG(j) for characterizing integrated circuits according to some examples. This relationship between (i) strengths $S_p$, $S_n$ and (ii) frequency F and high period gradient HPG(j) can be determined, for example, from a second-order polynomial model determined by a regression analysis. In the characterization of FIG. 2, a first letter refers to the n-type transistor corner, and the second letter refers to the p-type transistor corner. As shown in FIG. 2, a slow-slow ("SS") die has a lowest frequency, while a fast-fast ("FF") die has a highest frequency. Generally, typical-typical ("TT"), fast-slow ("FS"), and slow-fast ("SF") dies have approximately a same frequency between the respective frequencies of the SS die and FF die. Further, fast-typical ("FT") and typical-fast ("TF") dies have approximately a same frequency that is between the frequency of the FF die and the approximately same frequencies of the TT, FS, and SF dies. Slow-typical ("ST") and typical-slow ("TS") dies have approximately a same frequency that is between the frequency of the SS die and the approximately same frequencies of the TT, FS, and SF dies.

Generally, when strengths $S_p$, $S_n$ are approximately balanced, such as with the SS, TT, and FF dies, the high period gradient HPG(j) is near or is zero. When strength $S_n$ is greater than the strength $S_p$, the high period gradient HPG(j) is greater than zero and increases with a greater difference between the strength 5, and strength $S_p$. As illustrated TS and FT dies have respective high period gradients HPG(j) that are greater than zero but are less than a high period gradient HPG(j) of a FS die. When strength $S_p$ is greater than the strength $S_n$, the high period gradient HPG(j) is less than zero and decreases with a greater difference between the strength $S_p$ and strength $S_n$. As illustrated ST and TF dies have respective high period gradients HPG(j) that are less than zero but are greater than a high period gradient HPG(j) of a SF die.

Accordingly, by detecting a high period gradient HPG(j) and a frequency F of a ring oscillator 100, the ring oscillator 100, and possibly, the integrated circuit in which the ring oscillator 100 is disposed and/or die, can be characterized. The plot of FIG. 2 is generalized, and a person having ordinary skill in the art will readily understand that continuums of frequency F and high period gradient HPG(j) that may be realized on a die. Distinctions and determinations as to what is characterized as slow, typical, and fast can be at any appropriate points along these continuums.

Additionally, the plot of FIG. 2 is illustrated using high period gradient HPG(j) and frequency F. Similar relationships may be obtained by substituting duty cycle gradient DCG(j) for high period gradient HPG(j), by substituting a low period gradient for high period gradient HPG(j), and/or by substituting period P for frequency F.

Figure 3:
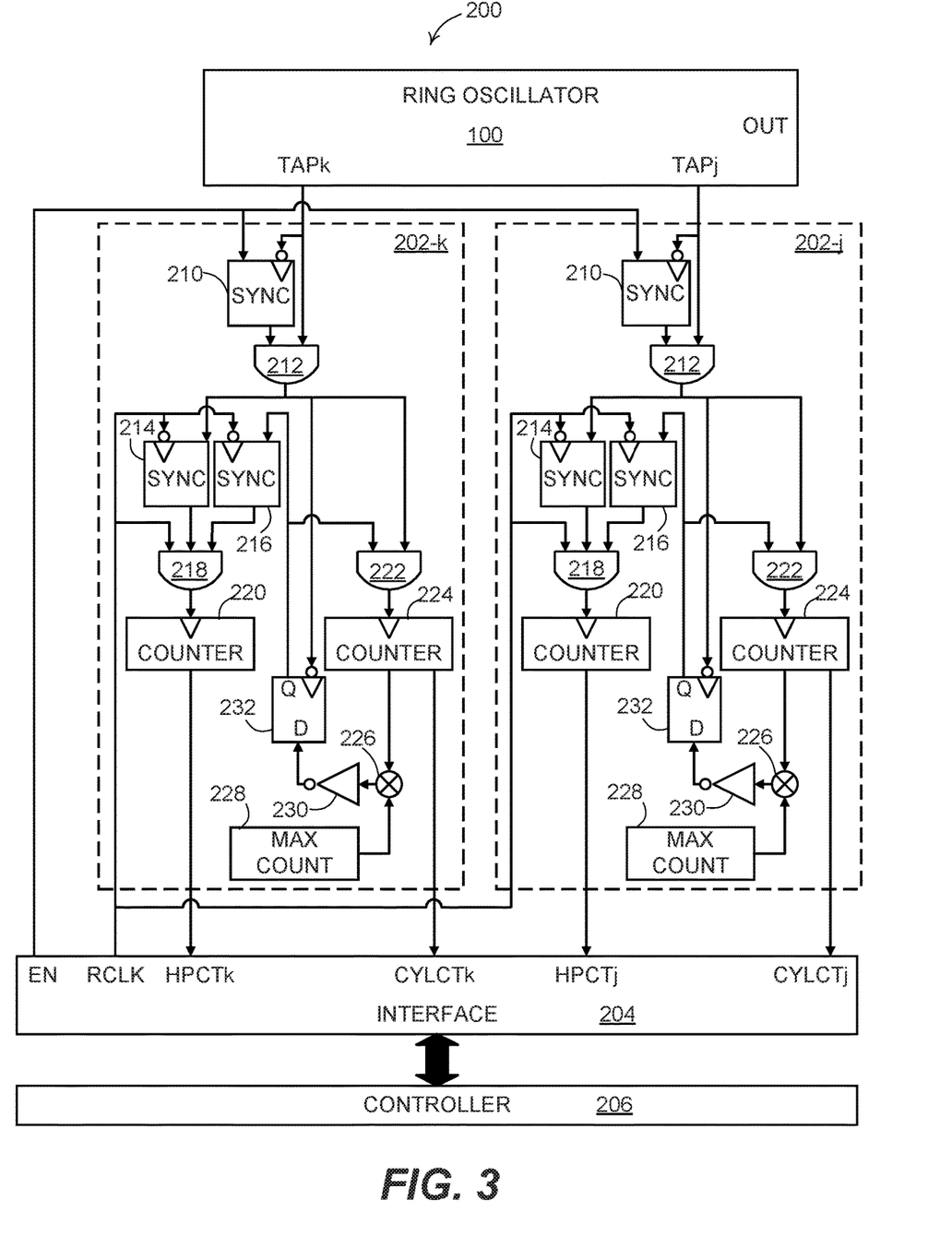
FIG. 3 is a sensor circuit that may be used to characterize an integrated circuit according to some examples.

FIG. 3 illustrates a sensor circuit 200 that may be used to characterize an integrated circuit according to some examples. The sensor circuit 200 includes a ring oscillator 100 and detector circuits 202-k, 202-j (individually or collectively, detector circuit(s) 202). FIG. 3 further illustrates an interface circuit 204 and a controller 206. The interface circuit 204 may be included, for example, when the controller 206 is off-chip. For example, the interface circuit 204 may be an IJTAG interface. In other examples, the controller 206 is on the same chip or die as the sensor circuit 200 and is connected to the detector circuits 202-k, 202-j. In such a case, the interface circuit 204 may be omitted. FIG. 3 further illustrates two detector circuits 202-k, 202-j. In other examples, more than two detector circuits 202 may be implemented connected to different tap nodes.

The ring oscillator 100 has a tap k node TAPk and a tap (k+j) node TAPj. The tap k node TAPk is a node where a high period $H_k$ is observed at a node k, and the tap (k+j) node TAPj is a node where a high period $H_{k+j}$ is observed at a node k+j. Hence, a high period gradient HPG(j) and/or duty cycle gradient DCG(j) can be determined using these tap nodes TAPk, TAPj. Use of tap k node TAPk and tap (k+j) node TAPj is generic to be consistent with the above analysis. Any number of tap nodes can be implemented, and a person having ordinary skill in the art will readily understand the correlation to such tap node to the above analysis. As an example, the tap k node TAPk and tap (k+j) node TAPj are the tap 0 node TAP0 and tap n node TAPN, respectively, in FIG. 1. The ring oscillator 100 has an output node OUT for outputting, e.g., a cyclic signal.

The detector circuit 202-k has an input node connected to the tap k node TAPk, and the detector circuit 202-j has an input node connected to the tap (k+j) node TAPj. The detector circuits 202 have a common schematic, and hence, description of a detector circuit 202 generally applies to both detector circuits 202-k, 202-j. In other examples, detector circuits 202 can have different schematics, such as indicated below.

A detector circuit 202 includes synchronizer circuits 210, 214, 216, AND gates 212, 218, 222, counters 220, 224, a comparator 226, a maximum count register 228, an inverter 230, and a flip-flop 232. The synchronizer circuits 210, 214, 216 each can be an appropriate type of synchronizer circuit or any other circuit capable of synchronizing signals. The counters 220, 224 can each be a ripple counter or other appropriate circuit that is capable of counting rising or falling edges of a signal. The maximum count register 228 can be or include any memory, such as any latch, volatile memory, or non-volatile memory (e.g., eFuses). Additionally, the logic of the AND gates 212, 218, 222 comparator 226, and inverter 230 can be modified to any equivalent circuit. The flip-flop 232 is illustrated as a D flip-flop, and in other examples, can be any other appropriate type of flip-flop. A person having ordinary skill in the art will readily understand that different logic, e.g., complementary logic, can be implemented.

The input node of the detector circuit 202 (e.g., connected to the respective tap node TAPk, TAPj) is connected to an inverted clock input node of the synchronizer circuit 210 and to an input node of the AND gate 212. An input node of the synchronizer circuit 210 is connected to an enable node EN of the interface circuit 204 (or, e.g., controller 206 in some examples). An output node of the synchronizer circuit 210 is connected to another input node of the AND gate 212.

An output node of the AND gate 212 is connected to an input node of the synchronizer circuit 214, an inverted clock input node of the flip-flop 232, and an input node of the AND gate 222. A reference clock node RCLK of the interface circuit 204 (or, e.g., controller 206 in some examples) is connected to an input node of the AND gate 218 and respective inverted clock input nodes of the synchronizer circuits 214, 216. An output node Q of the flip-flop 232 is connected to an input node of the synchronizer circuit 216 and an input node of the AND gate 222. Respective output nodes of the synchronizer circuits 214, 216 are connected to input nodes of the AND gate 218.

An output node of the AND gate 218 is connected to an input node of the counter 220, and an output node(s) of the counter 220 is connected to a high point counter node (e.g., high point counter node HPCTk or HPCTj) of the interface circuit 204 (or, e.g., controller 206 in some examples). An output node of the AND gate 222 is connected to an input node of the counter 224, and an output node(s) of the counter 224 is connected to a cycle counter node (e.g., cycle counter node CYLCTk or CYLCTj) of the interface circuit 204 (or, e.g., controller 206 in some examples). The output node(s) of each of the counters 220, 224 can be a multi-bit connection, for example.

Another output node(s) of the counter 224 is connected to an input node of the comparator 226, and an output node(s) of the maximum count register 228 is connected to another input node of the comparator 226. An output node of the comparator 226 is connected to an input node of the inverter 230, and an output node of the inverter 230 is connected to a data input node D of the flip-flop 232.

In operation, respective cyclic signals are output from the ring oscillator 100 on tap nodes TAPk, TAPj. These cyclic signals generally have a same frequency and period, and can have differing high periods and duty cycles. Generally, the detector circuit 202, when enabled by a signal on the enable node EN, counts (i) the number of cycles of the reference clock signal on the reference clock node RCLK that occur while the cyclic signal output on the respective tap node is high, and (ii) the number of cycles of the cyclic signal output on the respective tap node. For brevity in describing FIG. 3, a cyclic signal output on a tap node of the ring oscillator 100 is simply referred to as a cyclic signal; an enable signal on the enable node EN is simply referred to as an enable signal; and a reference clock signal on the reference clock node RCLK is simply referred to as a reference clock signal.

The detector circuit 202 includes two enable/disable mechanisms. One mechanism is the enable signal. The enable signal is input, via the synchronizer circuit 210, into the AND gate 212. When the enable signal is low, the output signal of the AND gate 212 remains low, which is propagated through the AND gate 218 (via synchronizer circuit 214) and the AND gate 222 to the counters 220, 224. While the inputs to the counters 220, 224 remain low, the counters 220, 224 do not count rising (or falling) edges input thereto. Hence, a low enable signal can disable the detector circuit 202. Another enable/disable mechanism is a comparison of the count of the counter 224 to a programmed amount of the maximum count register 228. The count of the counter 224 is compared, by the comparator 226, to the programmed amount of the maximum count register 228. If the count of the counter 224 remains less than the amount of the maximum count register 228, the output signal from the comparator 226 is low, which is inverted by the inverter 230 to high. If the count of the counter 224 is greater than the amount of the maximum count register 228, the output signal from the comparator 226 is high, which is inverted by the inverter 230 to low. This low signal output by the inverter 230 is propagated through the flip-flop 232 and through the AND gate 218 (via synchronizer circuit 216) and the AND gate 222 to the counters 220, 224. While the inputs to the counters 220, 224 remain low, the counters 220, 224 do not count rising (or falling) edges input thereto. Accordingly, the amount of the maximum count register 228 can be a ceiling amount for the counter 224 such that, when the counter 224 reaches the amount of the maximum count registers 228, the detector circuit 202 becomes disabled.

The cyclic signal is input to the AND gate 212 and the inverted clock input node of the synchronizer circuit 210. The enable signal is input to the synchronizer circuit 210. The synchronizer circuit 210 synchronizes the propagation of a rising (or falling) edge of the enable signal input to the AND gate 212 with a falling edge of the cyclic signal. This can, for example, prevent a false rising (or falling) edge output by the AND gate 212 that can be counted by a counter as a result of the enable signal transitioning from low to high (or high to low) while the cyclic signal is high. Accordingly, subject to the synchronization provided by the synchronizer circuit 210, the AND gate 212 outputs the cyclic signal when the enable signal is high; otherwise, the AND gate 212 outputs a low signal.

The signal output by the AND gate 212 is input to the AND gate 222 and to the inverted clock input node of the flip-flop 232. The signal output by the AND gate 212 can cause the flip-flop 232 to hold its state while the signal output by the AND gate 212 does not have a falling (or rising) edge. The flip-flop 232 is triggered to change state on a falling (or rising) edge of the signal output by the AND gate 212, which change of state further depends on the signal input on the input node D of the flip-flop 232. The signal output by the flip-flop 232 is also input to the AND gate 222, as described above. Hence, the respective signals output by the AND gate 212 and flip-flop 232 are ANDed together, and the resulting signal is output by the AND gate 222 to the counter 224. The counter 224 counts rising (or falling) edges of the signal output by the AND gate 222. Generally, when the enable signal is high and the count of the counter 224 is below the amount of the maximum count registers 228, the counter 224 counts the rising (or falling) edges of the cyclic signal output on the respective tap node TAPk, TAPj. This count of the counter 224 corresponds to the number of cycles of the cyclic signal during the time period in which the enable signal is high.

The reference clock signal is input to the AND gate 218 and respective inverted clock input nodes of the synchronizer circuits 214, 216. The signal output by the AND gate 212 is input into the synchronizer circuit 214, and the signal output by the flip-flop 232 is input into the synchronizer circuit 216. The synchronizer circuits 214, 216 synchronize the respective signals output by the AND gate 212 and the flip-flop 232 to the reference clock signal and output the synchronized signals to the AND gate 218. The reference clock signal and the respective synchronized signals output by the AND gate 212 and the flip-flop 232 are ANDed together, and the resulting signal is output by the AND gate 218 to the counter 220. The counter 220 counts rising (or falling) edges of the signal output by the AND gate 222. Generally, when the enable signal is high and the count of the counter 224 is below the amount of the maximum count registers 228, the counter 220 counts the rising (or falling) edges of the reference clock that occur while the cyclic signal output on the respective tap node TAPk, TAPj is high. This count of the counter 220 corresponds to the number of cycles of the reference clock signal during the time period in which both the cyclic signal and the enable signal are high.

The amounts of the counters 220, 224 can be read, via the interface circuit 204 (when implemented), by the controller 206. The controller 206 can provide the enable signal and the reference clock signal, and/or can be provided, via the interface circuit 204, the enable signal and reference clock signal. The controller 206 can determine a time period in which the enable signal is high based on the reference clock signal (e.g., number of cycles of the reference clock that the enable signal is high divided by the frequency of the reference clock).

The controller 206 can determine the frequency F of one or more of the cyclic signals by dividing the count from the counter 224 by the time period, and/or can determine the period P of more of the cyclic signals by dividing the time period by the count from the counter 224. Any of the counts from counters 224 can be used to determine a period P and/or frequency F. The period P and frequency F determined using any counter 224 should generally be equal, although some variance may be observed due to, e.g., propagation of rising or falling edges through the ring oscillator relative to when the enable signal is high. Since the period P and frequency F observed at a node are generally equal to the period and frequency observed at any other node in the ring oscillator 100, in some examples, a counter 224 and corresponding logic is implemented in one of the detector circuits 202 (e.g., where the output of the corresponding flip-flop 232 is distributed to other detector circuits 202). Further, in some examples, a counter 224 and corresponding logic is implemented outside of the detector circuits 202 for determining a frequency and/or period of a signal observed at any node of the ring oscillator 100.

The controller 206 can determine the duty cycles D of the respective cyclic signals by dividing the respective counts from the counters 220 by the number of cycles of the reference clock that occurred while the enable signal was high. The controller 206 can determine the high periods H of the respective cyclic signals by dividing (i) the product of (a) the time period and (b) the respective counts from the counters 220 by (ii) the product of (a) the number of cycles of the reference clock that occurred while the enable signal was high and (b) the respective counts from the counters 224. From these duty cycles D or high periods H, a duty cycle gradient DCG(j) and/or a high period gradient HPG(j) can be determined. For example, the high period H as determined based on the counter 220 of the detector circuit 202-$k$ can be subtracted from the high period H as determined based on the counter 220 of the detector circuit 202-$j$ to determine the high period gradient HPG(j). Similarly, the duty cycle D as determined based on the counter 220 of the detector circuit 202-$k$ can be subtracted from the duty cycle D as determined based on the counter 220 of the detector circuit 202-$j$ to determine the duty cycle gradient DCG(j).

The controller 206 can also receive the signal output by the flip-flop 232 and/or the signal output by the synchronizer circuit 216. Any of these signals, when low, can indicate that the counter 224 has exceeded the amount of the maximum count register 228 to disable further counting by the counters 220, 224. Hence, these signals transitioning to low can cause the controller 206 to de-assert the enable signal and/or to reset the detector circuits 202 and assert the enable signal for a shorter duration. For example, if the enable signal remains asserted (e.g., high) after the signal output by the synchronizer circuit 216 transitions to low, the controller 206 may not correctly calculate parameters when such calculation is based on the time period that the enable signal is high. The controller 206 may be configured to reset the counters 220, 224 at any time, such as before asserting the enable signal.

Some examples provided herein aim to increase the sensitivity of frequency F and/or period P and the sensitivity of high period gradient HPG(j) and/or duty cycle gradient DCG(j) to systematic process variation. By increasing such sensitivities, characterization of the strengths $S_p$, $S_n$ can be more accurate, and/or confidence in any given characterization of the strengths $S_p$, $S_n$ can be greater.

The below analysis aims to generally identify how changes in rise or fall-times of the transistors MNX, MPX, MNY, MPY affect changes in frequency F, period P, high period gradient HPG(j), and duty cycle gradient DCG(j) from their designed or nominal values. Rise and fall-time sensitivity variables indicate how sensitive rise and fall-times, respectively, of a transistor are to systematic process variation and represent a change in rise and fall-time, respectively, as a function of systematic process variation. As an example, assuming all other physical characteristics are the same, a p-type transistor with a channel width of 1× would have a rise-time that is more sensitive to systematic process variation and would have a greater rise-time sensitivity than a p-type transistor with a channel width of 8×. The p-type transistor having the channel width of 8× would experience less change in rise-time due to systematic process variation than the p-type transistor having the channel width of 1× that is subjected to the same systematic process variation. Rise and fall-time sensitivity variables are introduced into the analysis above to illustrate how changing rise and fall-time sensitivities (e.g., by changing physical characteristics of respective transistors) affects frequency F, period P, high period gradient HPG(j), and duty cycle gradient DCG(j). As indicated above, rise-times and fall-times serve as proxies for strengths $S_p$, $S_n$; hence, changes in rise-times and fall-times as a function of systematic process variation, as indicated by rise and fall-times sensitivity variables, also serve as proxies for strengths $S_p$, $S_n$.

Changes in strengths $S_p$ of p-type transistors primarily affect (in the first order) the rise-times of inverters, while fall-times of the inverters remain relatively unchanged. Similarly, changes in strengths $S_n$ of n-type transistors primarily affect (in the first order) the fall-times of inverters, while rise-times of the inverters remain relatively unchanged. Changes from designed or nominal rise-times and fall-times of inverters X, Y, 104 due to systematic process variation are shown below.

$$X_r' = X_r - x_r; X_f' = X_f - x_f;$$

$$Y_r' = Y_r - y_r; Y_f' = Y_f - y_f;$$

$$Z_r' = Z_r - z_r; Z_f' = Z_f - z_f.$$

Changed rise-times $X_r'$, $Y_r'$, $Z_r'$ are equal to the nominal rise-times $X_r$, $Y_r$, $Z_r$, minus the rise-time sensitivities $x_r$, $y_r$, $z_r$, respectively, which introduce sensitivity of respective p-type transistors to systematic process variation. Changed fall-times $X_f'$, $Y_f'$, $Z_f'$ are equal to the nominal fall-times $X_f$, $Y_f$, $Z_f$ minus the fall-time sensitivities $x_f$, $y_f$, $z_f$, respectively, which introduce sensitivity of respective n-type transistors to systematic process variation. If p-type transistors are stronger than the designed or nominal value due to systematic process variation, the rise-time sensitivities $x_r$, $y_r$, $z_r$ are each greater than zero. If p-type transistors are weaker than the designed or nominal value due to systematic process variation, the rise-time sensitivities $x_r$, $y_r$, $z_r$ are each less than zero. If n-type transistors are stronger than the designed or nominal value due to systematic process variation, the fall-time sensitivities $x_f$, $y_f$, $z_f$ are each greater than zero. If n-type transistors are weaker than the designed or nominal value due to systematic process variation, the fall-time sensitivities $x_f$, $y_f$, $z_f$ are each less than zero.

Further, resulting from the above changed rise-times $X_r'$, $Y_r'$ and changed fall-times $X_f'$, $Y_f'$, a changed fall-time $T_f'$ and a changed rise-time $T_r'$ for a buffer 102 are shown below.

$$T_f'=X_r'+Y_f'=X_r-x_r+Y_f-y_f=T_f-x_r-y_f;$$

$$T_r'=X_f'+Y_r'=X_f-x_f+Y_r-y_r=T_r-x_f-y_r.$$

Similarly, resulting from the above changed rise-times $X_r'$, $Y_r'$ and changed fall-times $X_f'$, $Y_f'$, a changed period P' for the ring oscillator 100 resulting from systematic process variation is shown below.

$$P'=n(T_r'+T_f')+Z_r'+Z_f'=n(T_r-x_f-y_r+T_f-x_r-y_f)+Z_r-z_r+Z_f-z_f=P-[n(x_r+x_f+y_r+y_f)+z_f+z_r]$$

$$P-P'=n(x_r+x_f+y_r+y_f)+Z_r+z_f.$$

A changed high period $H_{k,P}'$ observed at node k resulting from the above changed rise-times $X_r'$, $Y_r'$, $Z_r'$ and changed fall-times $X_f'$, $Y_f'$, $Z_f'$ is shown below.

$$H_k'=(n-k)T_r'+kT_f'+Z_f'=(n-k)(T_r-x_f-y_r)+k(T_f-x_r-y_f)+Z_f-z_f=H_k-[(n-k)(x_f+y_r)+k(x_r+y_f)+z_f];$$

$$H_k-H_k'=n(x_f+y_r)+k(x_r-x_f+y_f-y_r)+z_f.$$

A changed high period gradient $HPG_P'(j)$ resulting from the above changed rise-times $X_r'$, $Y_r'$, $Z_r'$ and changed fall-times $X_f'$, $Y_f'$, $Z_f'$ is shown below.

$$HPG'(j)=j[(X_r'-X_f')+(Y_f'-Y_r')]=j[(X_r-x_r-X_f+x_f)+(Y_f-y_f-Y_r+y_r)]=HPG(j)-j(x_r-x_f+y_f-y_r)$$

$$HPG(j)-HPG'(j)=j[(x_r-x_f)+(y_f-y_r)]=j[(x_r-y_r)+(y_f-x_f)].$$

From the above analysis, some observations can be made. Change in high period $H_k$ observed at node k from a nominal high period $H_k$ due to systematic process variation (e.g., $H_k-H_k'$) can be a function of rise-time and fall-time sensitivities of p-type transistors and n-type transistors, respectively, as well as the position of the node k where the high period $H_k$ is observed. Change in high period gradient HPG(j) from a nominal high period gradient HPG(j) due to systematic process variation observed at node positions j buffers apart (e.g., HPG(j)–HPG'(j)) is independent of the position of the nodes where the high period gradient HPG(j) is observed.

If the inverters X, Y in a buffer 102 are identical, the values of rise-time sensitivities $x_r$, $y_r$ are likely to be similar or the same, and the values of fall-time sensitivities $x_f$, $y_f$ are likely to be similar or the same. Accordingly, change in the high period gradient HPG(j) from a nominal high period gradient HPG(j) due to systematic process variation would be expected to be small or zero if the inverters X, Y are identical. The physical characteristics of the inverters X, Y in a buffer 102, according to some examples, are therefore different such that at least one of the rise-time and fall-time sensitivities $x_r$, $y_r$, $x_f$, $y_f$ differs from another, and the high period gradient HPG(j) can be used to determine strengths $S_p$, $S_n$. In some examples, a strength of one or more transistors of the inverters X, Y in a buffer 102 differs from a strength of another one or more transistors of the inverters X, Y in the buffer 102. The nominal high period gradient HPG(j) may be nonzero.

Additionally, the further apart the two observation positions for the high period gradient HPG(j) are (e.g., the larger the value of j is) the larger the change in high period gradient HPG(j) is expected to be. Thus, in order to maximize the magnitude of a measurement of the high period gradient HPG(j), j can equal the n number of serially connected buffers 102 in the ring oscillator 100 (e.g., j=n).

A way to increase sensitivity of frequency F and/or period P to systematic process variation is to increase the n number of serially connected buffers 102 in the ring oscillator. As shown by the above analysis, change in period P from a nominal period P due to systematic process variation (e.g., P–P') is a linear function of the n number of buffers 102, and hence, increasing the n number increases the sensitivity of period P and frequency F to systematic process variation.

Additionally, a way to increase the sensitivity of the high period gradient HPG(j) to systematic process variation is to increase the value of j, such as to j=n. In the illustration of FIG. 1, j=n corresponds to determining the high period gradient HPG(j) between tap 0 node TAP0 and tap n node TAPN. As shown by the above analysis, the change in the high period gradient HPG(j) from a nominal high period gradient HPG(j) due to systematic process variation (e.g., HPG(j)–HPG'(j)) is a linear function of j, and hence, increasing j, such as to be equal to the n number, increases the sensitivity of high period gradient HPG(j) to systematic process variation.

A further way to increase sensitivity of frequency F and period P is to increase, in the aggregate, the rise-time sensitivities $x_r$, $y_r$ and fall-time sensitivities $x_f$, $y_f$ of the inverters X, Y of the buffers 102. Since sensitivity of the high period gradient HPG(j) is a function of a difference of rise-time sensitivities $x_r$, $y_r$ and a difference of fall-time sensitivities $x_f$, $y_f$, increasing the sensitivities $x_r$, $y_r$, $x_f$, $y_f$ to equal amounts, or increasing rise-time sensitivities $x_r$, $y_r$ to equal amounts and fall-time sensitivities $x_f$, $y_f$ to other equal amounts, can reduce sensitivity of the high period gradient HPG(j). However, sensitivity of the high period gradient HPG(j) can be increased by (i) increasing the rise-time sensitivity $x_r$ and/or the fall-time sensitivity $y_f$ to a respective greater amount than the amounts to which the rise-time sensitivity $y_r$ and/or fall-time sensitivity $x_f$ are increased, or (ii) increasing the rise-time sensitivity $y_r$ and/or the fall-time sensitivity $x_f$ to a respective greater amount than the amounts to which the rise-time sensitivity $x_r$ and/or fall-time sensitivity $y_f$ are increased.

A way to increase sensitivity of the high period gradient HPG(j) to systematic process variation may be to increase a magnitude of a difference between the rise-time and fall-time sensitivities $x_r$, $x_f$ of the inverter X and/or to increase a magnitude of a difference between the fall-time and rise-time sensitivities $y_f$, $y_r$ of the inverter Y. For example, a way to increase sensitivity of the high period gradient HPG(j) is to increase the fall-time sensitivity $x_f$ of the inverter X and the rise-time sensitivity $y_r$ of the inverter Y, and/or to decrease the rise-time sensitivity $x_r$ of the inverter X and the fall-time sensitivity $y_f$ of the inverter Y. Alternatively, a way to increase sensitivity of the high period gradient HPG(j) is to increase the rise-time sensitivity $x_r$ of the inverter X and the fall-time sensitivity $y_f$ of the inverter Y, and/or decrease the fall-time sensitivity $x_f$ of the inverter X and the rise-time sensitivity $y_r$ of the inverter Y. Any of these increases and/or decreases can result in asymmetric inverters X, Y in a buffer 102. These can result in an inverter X, Y being imbalanced. Additionally, the high period gradient HPG(j) is non-zero for asymmetric inverters. Also, as shown above, the difference HPG(j)–HPG'(j) is a function of a difference between the rise-time and fall-time sensitivities $x_r$, $x_f$ of the inverter X (e.g., $x_r$–$x_f$) and a difference between the fall-time and rise-time sensitivities $y_f$, $y_r$ of the inverter Y (e.g., $y_f$–$y_r$). Accordingly, increasing the magnitude of one or both of these differences increases the sensitivity of the high period gradient HPG(j). The sensitivities $x_f$, $x_r$, $y_f$, $y_r$, even with some being decreased, can be increased in the aggregate to increase sensitivity of frequency F and period P to systematic process variation.

A way to increase sensitivity of the high period gradient HPG(j) to systematic process variation may be to increase the rise-time and fall-time sensitivities of one of the inverters X, Y, while decreasing the rise-time and fall-time sensitivities of the other of the inverters X, Y. For example, a way to increase sensitivity of the high period gradient HPG(j) is to increase the fall-time and rise-time sensitivities $x_f$, $x_r$ of the inverter X, and to decrease the fall-time and rise-time sensitivities $y_f$, $y_r$ of the inverter Y. Alternatively, a way to increase sensitivity of the high period gradient HPG(j) is to increase the fall-time and rise-time sensitivities $y_f$, $y_r$ of the inverter Y, and to decrease the fall-time and rise-time sensitivities $x_f$, $x_r$ of the inverter X. Any of these increases and decreases can result in individual symmetric inverters X, Y in a buffer 102. The inverters X, Y can each be balanced. The inverters X, Y can result in an imbalanced buffer 102. Additionally, the high period gradient HPG(j) can be zero for symmetric inverters. As shown above, the sensitivity of the high period gradient HPG(j) is a function of a difference between the rise-time and fall-time sensitivities $x_r$, $x_f$ of the inverter X (e.g., $x_r$–$x_f$) and a difference between the fall-time and rise-time sensitivities $y_f$, $y_r$ of the inverter Y (e.g., $y_f$–$y_r$). Accordingly, increasing the rise-time and fall-time sensitivities of one of the inverters X, Y, while decreasing the sensitivities of the other of the inverters X, Y permits the nominal high period gradient HPG(j) to be zero while increasing sensitivity of the high period gradient HPG(j) to systematic process variation. The sensitivities $x_f$, $x_r$, $y_f$, $y_r$, even with some being decreased, can be increased in the aggregate to increase sensitivity of frequency and period to systematic process variation.

Generally, increasing sensitivity of the high period gradient HPG(j) to systematic process variation can be realized by having one or more of the sensitivities $x_f$, $x_r$, $y_f$, $y_r$ being different from the remainder of the sensitivities $x_f$, $x_r$, $y_f$, $y_r$. Various examples described above illustrate different permutations for increasing/decreasing sensitivities $x_f$, $x_r$, $y_f$, $y_r$. When sensitivities $x_f$, $x_r$, $y_f$, $y_r$ are described as being increased or decreased, the sensitivities are increased or decreased relative to a starting amount where the respective amounts of the sensitivities are equal (e.g., $x_f$=$x_r$=$y_f$=$y_r$). Hence, when a first sensitivity is described as being increased while a second is described as being decreased, the amount to which the first sensitivity is increased is greater than the amount to which the second sensitivity is decreased. When first and second sensitivities are described as being increased, no relation between the respective amounts to which the first and second sensitivities are increased is necessarily implied. Similarly, when first and second sensitivities are described as being decreased, no relation between the respective amounts to which the first and second sensitivities are decreased is necessarily implied.

The sensitivities $x_f$, $x_r$, $y_f$, $y_r$ affect rise and fall-times of transistors as a result of systematic process variation, and such rise and fall-times are indicative of strengths $S_p$, $S_n$. The strengths $S_p$, $S_n$ are generally composites of electrical characteristics of p-type or n-type transistors, and the electrical characteristics are affected by physical characteristics of the respective transistors. Hence, changing sensitivities $x_f$, $x_r$, $y_f$, $y_r$ in inverters X, Y, which changes the strengths $S_p$, $S_n$ when systematic process variation occurs, is affected by changing physical characteristics of respective transistors associated with the sensitivities $x_f$, $x_r$, $y_f$, $y_r$. Accordingly, one or more of the strengths of transistors MPX, MNX, MPY, MNY being different from the remainder of the strengths of transistors MPX, MNX, MPY, MNY can be realized by one or more physical characteristics of the corresponding transistor being different from the corresponding physical characteristics of the other transistors. This can affect a saturation drive current $I_{Dsat}$, leakage current $I_{lkg}$, threshold voltage $V_t$, etc.

In some examples, respective strengths of transistors of the inverters X, Y that affect a rise or fall-time of a signal propagated through the respective buffer 102 are greater than respective strengths of transistors of the inverters X, Y that affect the other of the rise or fall-time of a signal propagated through the respective buffer 102. For example, transistors MPX, MNY affect a fall-time of a signal propagated through a buffer 102, and transistors MNX, MPY affect a rise-time of a signal propagated through the buffer 102. In some examples, respective strengths of the transistors MPX, MNY are greater than respective strengths of the transistors MNX, MPY. In some examples, respective strengths of the transistors MNX, MPY are greater than respective strengths of the transistors MPX, MNY. In these examples, each of the inverters X, Y can be imbalanced and asymmetric.

In some examples, respective strengths of the transistors of one of the inverters X, Y are greater than respective strengths of the transistors of the other of the inverters X, Y. In some examples, respective strengths of the transistors MPX, MNX are greater than respective strengths of the transistors MPY, MNY. In some examples, respective strengths of the transistors MPY, MNY are greater than respective strengths of the transistors MPX, MNX. In these examples, each of the inverters can be balanced and symmetric.

In a specific example, a ring oscillator 100 has 60 serially connected buffers 102. With reference to FIG. 1, n=60 in this example. Each of the buffers 102 had a balanced inverter X and a balanced inverter Y. The strength of the p-type transistor and the strength of the n-type transistor of the inverter X were equal, and the strength of the p-type transistor and the strength of the n-type transistor of the inverter Y were equal. The inverter X was larger than the inverter Y. The drive strength of inverter X was therefore larger than the drive strength of the inverter Y. The p-type and n-type transistors of the inverter X had 8 times the drive strength of the p-type and n-type transistors of the inverter Y. For example, the channel widths of the p-type and n-type transistors of the inverter X were 8 times larger than the channel widths of the p-type and n-type transistors of the inverter Y, which resulted in the rise and fall-time sensitivities $x_r$, $x_f$ being greater than the rise and fall-time sensitivities $y_r$, $y_f$.

Figure 4:
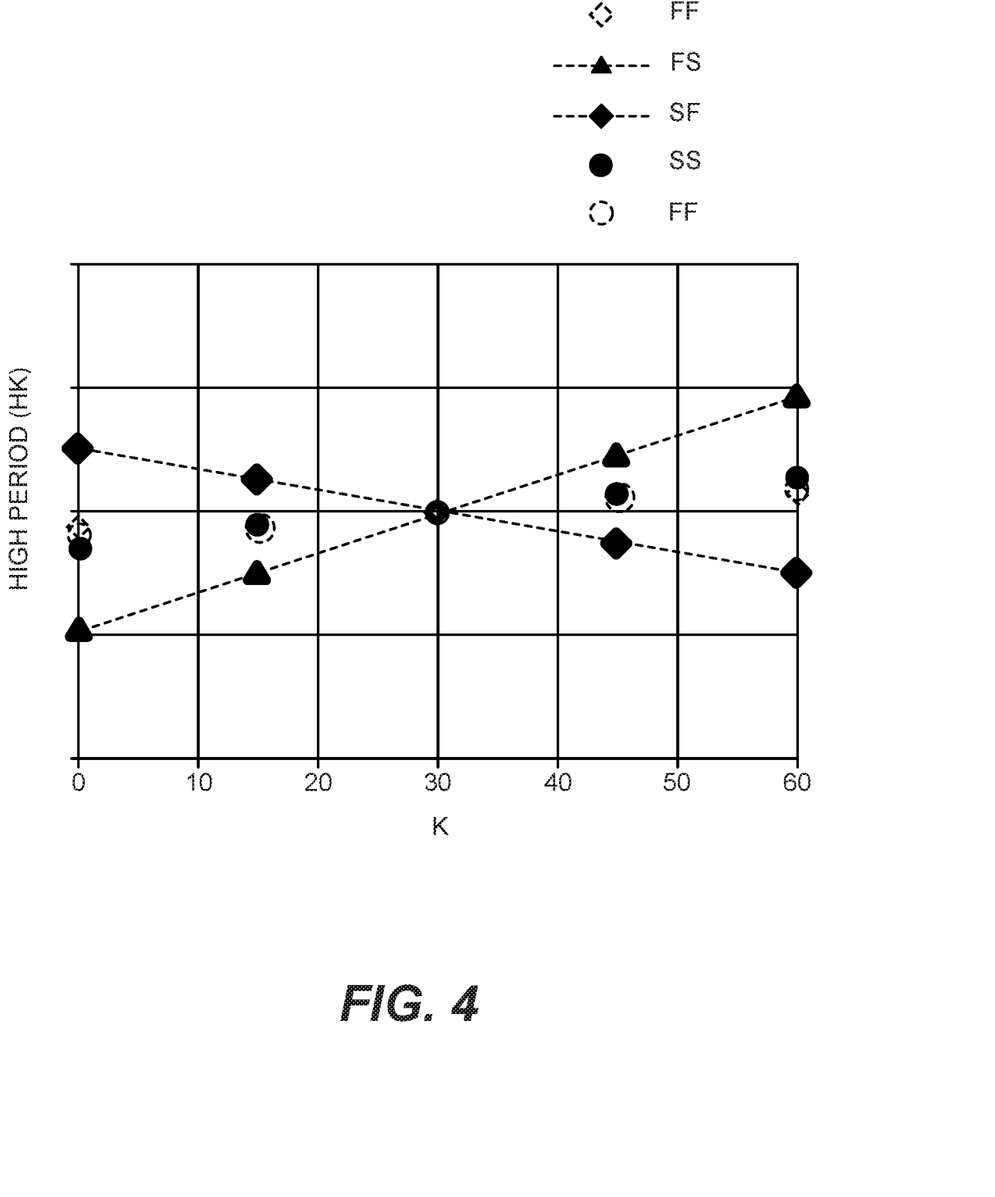
FIG. 4 is a chart illustrating example observed high periods of a number of samples of an example ring oscillator.

FIG. 4 is a chart illustrating example observed high periods $H_k$ of a number of samples of the above described example ring oscillator 100 with 60 serially connected buffers 102 according to an example. Since high period H is a linear function of duty cycle D (e.g., H=D*P), FIG. 4 can also represent observed duty cycles of the samples. The observed high periods $H_k$ were observed at a number of respective tap nodes k.

For samples where systematic process variation generally affects both p-type and n-type similarly, the inverters X, Y generally remain balanced so the observed high periods $H_k$ at various tap nodes k for those samples are approximately equal. As shown, the observed high periods $H_k$ at various tap nodes k for a fast-fast ("FF") sample are generally equal, such that the high period gradient HPG(j) of the sample is approximately zero (e.g., HPG(j)=$H_{k+j}$–$H_k$=$H_{60}$–$H_0$≈0). A same observation is applicable to the typical-typical ("TT") and slow-slow ("SS") samples.

For samples where systematic process variation does not affect p-type and n-type similarly, the inverters X, Y generally become imbalanced so the observed high periods $H_k$ at various tap nodes k for those samples differ creating a non-zero high period gradient HPG(j). As shown, the observed high periods $H_k$ at various tap nodes k for a fast-slow ("FS") sample increase from tap k=0 to tap k=60, such that the high period gradient HPG(j) of the sample is a relatively large positive amount (e.g., HPG(j)=$H_{k+j}$–$H_k$=$H_{60}$–$H_0$>0). As shown, the observed high periods $H_k$ at various tap nodes k for a slow-fast ("SF") sample decrease from tap k=0 to tap k=60, such that the high period gradient HPG(j) of the sample is a relatively large negative amount (e.g., HPG(j)=$H_{k+j}$–$H_k$=$H_{60}$–$H_0$<0).

It would be expected that samples characterized as typical-slow ("TS") and fast-typical ("FT") would have corresponding observed high periods $H_k$ at various tap nodes k increase from tap k=0 to tap k=60, albeit at less of an increase than the FS sample. Hence, it would be expected that the high period gradients for the balanced FF, TT, and SS samples $HPG_{FF,TT,SS}(j)$, the high period gradients for the TS and FT samples $HPG_{TS,FT}(j)$, and the high period gradients for the FS sample $HPG_{FS}(j)$ generally follow $HPG_{FF,TT,SS}(j)<HPG_{TS,FT}(j)<HPG_{FS}(j)$.

Similarly, it would be expected that samples characterized as slow-typical ("ST") and typical-fast ("TF") would have corresponding observed high periods $H_k$ at various tap nodes k decrease from tap k=0 to tap k=60, albeit at less of a decrease than the SF sample. Hence, it would be expected that the high period gradients for the balanced FF, TT, and SS samples $HPG_{FF,TT,SS}(j)$, the high period gradients for the ST and TF samples $HPG_{ST,TF}(j)$, and the high period gradients for the SF sample $HPG_{SF}(j)$ generally follow $HPG_{FF,TT,SS}(j)<HPG_{ST,TF}(j)<HPG_{SF}(j)$.

As illustrated by FIG. 4, systematic process variation that causes imbalance in inverters X, Y can be detected based on a high period gradient HPG(j). For example, dies characterized as FS and SF can be identified. For other characterizations, the high period gradient HPG(j) may not be sufficient to characterize dies. For example, a high period gradient HPG(j) may be equal for TS and FT dies, and a high period gradient HPG(j) may be equal for ST and TF dies. As indicated previously with respect to FIG. 2, FF, TT, and SS samples can be distinguished by a change in frequency or period from a nominal frequency or period, respectively; TS and FT samples can be distinguished by a change in frequency or period from a nominal frequency or period, respectively; and ST and TF samples can be distinguished by a change in frequency or period from a nominal frequency or period, respectively.

In some examples, the sensor circuit of FIG. 3 is in a scribe line of a wafer. The interface circuit 204 can be an IJTAG interface that has external electrical connections that are probed during wafer testing (e.g., wafer acceptance testing (WAT)). A controller 206 can be in, e.g., a computer or other processor-based system separate from the wafer and can become communicatively coupled to the interface circuit 204 when the wafer is contacted with a probe head communicatively coupled to the controller 206. The controller 206 can cause the ring oscillator 100 and detector circuits 202 to be powered and operating. The controller 206 can transmit a reference clock signal and enable signal via the interface circuit 204 and can receive counts from counters 220, 224 via the interface circuit 204. The controller 206 can determine at least one of frequency F or period P of a cyclic signal of the ring oscillator 100 and at least one of a high period gradient HPG(j) or duty cycle gradient DCG(j) of the ring oscillator 100 as described above. Based on this determination, one or more dies on the wafer can be characterized.

In some examples, the sensor circuit of FIG. 3 is in field to an integrated circuit and can act like a system monitor. The integrated circuit can further include the controller 206, and the interface circuit 204 can be omitted. The controller 206 can transmit a reference clock signal and enable signal and can receive counts from counters 220, 224. The controller 206 can determine at least one of frequency F or period P of a cyclic signal of the ring oscillator 100 and at least one of a high period gradient HPG(j) or duty cycle gradient DCG(j) of the ring oscillator 100 as described above. Based on this determination, the controller 206 can control another circuit(s) of the integrated circuit to compensate for changing conditions of the integrated circuit. For example, changing temperature or time-dependent degradation can change the strengths of transistors, which can result in a change to the determined frequency and/or period and a change to the determined high period gradient and/or duty cycle gradient. The controller 206 can change settings in the other circuit(s) to accommodate or recalibrate for these changes. Additionally, multiple sensor circuits can be included throughout an integrated circuit to obtain more precise observations of conditions relevant to any given circuit.

Figure 5:
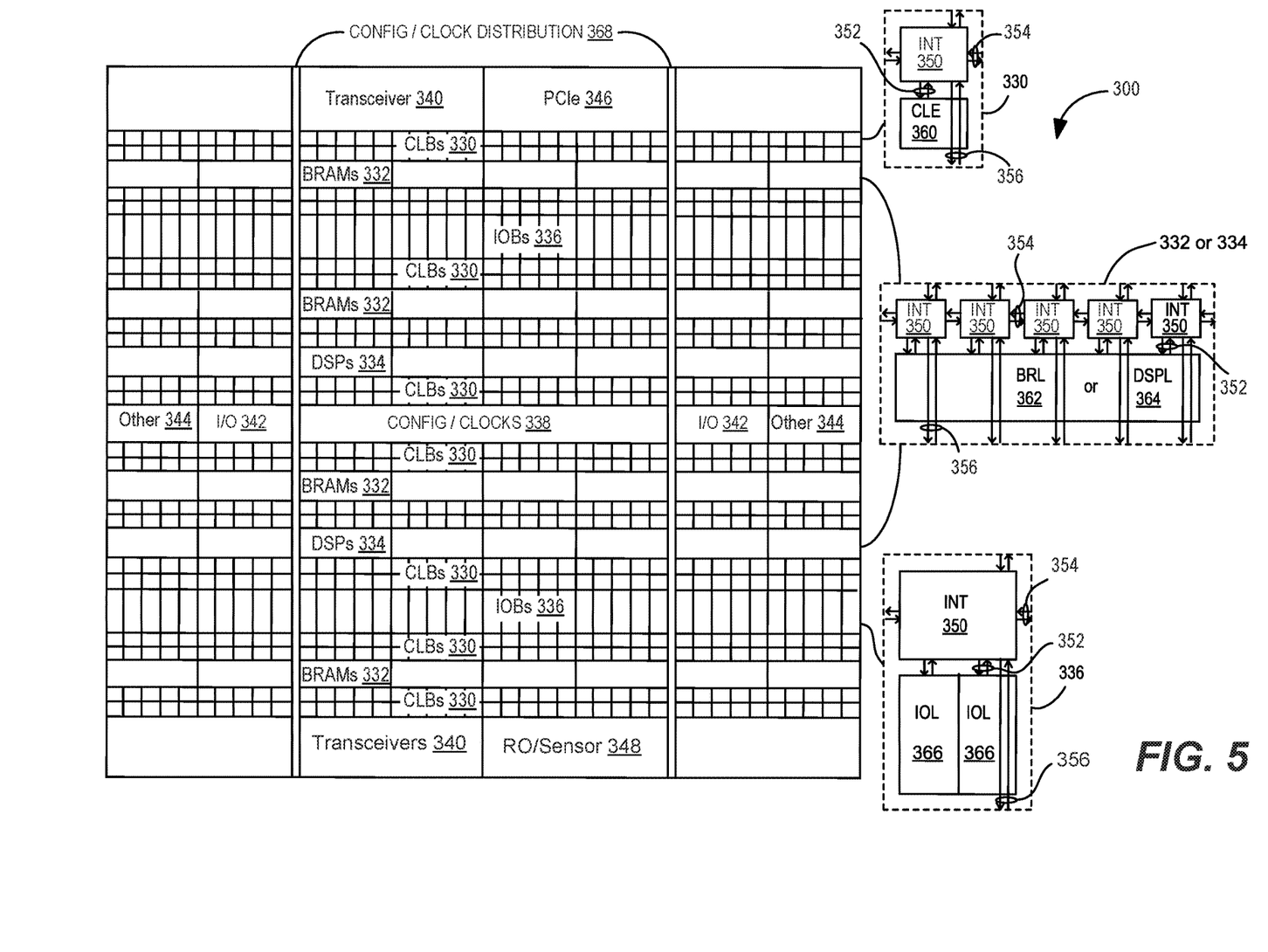
FIG. 5 illustrates a field programmable gate array (FPGA) of a programmable integrated circuit that may include a sensor circuit according to some examples.

FIG. 5 illustrates a field programmable gate array (FPGA) of a programmable integrated circuit 300 that may include a sensor circuit as described herein, according to some examples. The programmable integrated circuit 300 includes a large number of different programmable tiles (e.g., that form a programmable fabric) including configurable logic blocks ("CLBs") 330, random access memory blocks ("BRAMs") 332, signal processing blocks ("DSPs") 334, input/output blocks ("IOBs") 336, configuration and clocking logic ("CONFIG/CLOCKS") 338, digital transceivers 340, specialized input/output blocks ("I/O") 342 (e.g., configuration ports and clock ports), and other programmable logic 344 such as digital clock managers, system monitoring logic, and so forth. The FPGA can also include PCIe interfaces 346, ring oscillator and/or sensor circuit (RO/sensor) 348, and the like.

In some FPGAs, each programmable tile can include at least one programmable interconnect element ("INT") 350 having connections to input and output terminals 352 of a programmable logic element within the same tile, as shown by examples included in FIG. 5. Each programmable interconnect element 350 can also include connections to interconnect segments 354 of adjacent programmable interconnect element(s) in the same tile or other tile(s). Each programmable interconnect element 350 can also include connections to interconnect segments 356 of general routing resources between logic blocks (not shown). The general routing resources can include routing channels between logic blocks (not shown) comprising tracks of interconnect segments (e.g., interconnect segments 356) and switch blocks (not shown) for connecting interconnect segments. The interconnect segments of the general routing resources (e.g., interconnect segments 356) can span one or more logic blocks. The programmable interconnect elements 350 taken together with the general routing resources implement a programmable interconnect structure ("programmable interconnect") for the illustrated FPGA.

In an example implementation, a CLB 330 can include a configurable logic element ("CLE") 360 that can be programmed to implement user logic plus a single programmable interconnect element ("INT") 350. A BRAM 332 can include a BRAM logic element ("BRL") 362 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 334 can include a DSP logic element ("DSPL") 364 in addition to an appropriate number of programmable interconnect elements. An 10B 336 can include, for example, two instances of an input/output logic element ("IOL") 366 in addition to one instance of the programmable interconnect element 350. As will be clear to those of skill in the art, the actual I/O pads connected, for example, to the input/output logic element 366 typically are not confined to the area of the input/output logic element 366.

In the pictured example, a horizontal area near the center of the die is used for configuration, clock, and other control logic. Vertical columns 368 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic.

The RO/sensor 348 includes the ring oscillator 100. The detector circuits 202 and controller 206 can be implemented as configured logic in the programmable fabric (e.g., in any of the CLBs 330, BRAMs 332, DSPs 334, IOBs 336, etc.). In some examples, the detector circuits 202 and controller 206 can be included in the RO/sensor 348, such as by being hardened logic circuits. The RO/sensor 348 can be used to, e.g., change settings relating to dual data rate (DDR) signals, such as for a DDR memory controller, or change settings relating to the clock tree network in the programmable fabric of the programmable integrated circuit 300.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 6:
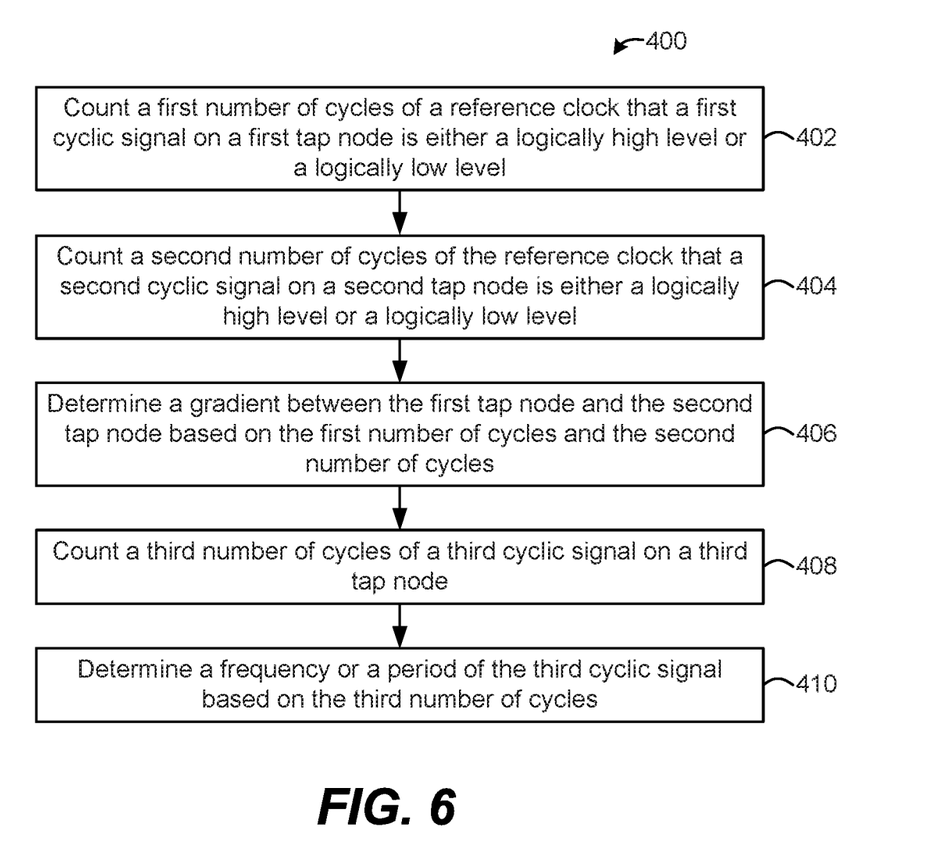
FIG. 6 is a flowchart of a method for determining skew of an integrated circuit according to some examples.

FIG. 6 is a flowchart of a method 400 for determining skew of an integrated circuit according to some examples. The method 400 can be performed using the sensor circuit of FIG. 3 in some examples.

At block 402, a first number of cycles of a reference clock that a first cyclic signal on a first tap node is either a logically high level or a logically low level is counted. The counting of block 402 can be performed by the detector circuit 202-$k$, for example. The first tap node is along serially connected buffers 102 of a ring oscillator 100, such as tap 0 node TAP0.

At block 404, a second number of cycles of the reference clock that a second cyclic signal on a second tap node is either a logically high level or a logically low level is counted. The counting of block 404 can be performed by the detector circuit 202-$j$, for example. The second tap node is along the serially connected buffers 102 and is different from the first tap node. For example, the second tap node can be tap n node TAPN.

At block 406, a gradient between the first tap node and the second tap node is determined based on the first number of cycles and the second number of cycles. The determining of block 406 can be performed by the controller 206. The gradient can a high period gradient or a duty cycle gradient. The high period gradient is a difference between a high period of the first cyclic signal and a high period of the second cyclic signal, where the high period of the first cyclic signal is based on the first number of cycles, and the high period of the second cyclic signal is based on the second number of cycles. The duty cycle gradient is a difference between a duty cycle of the first cyclic signal and a duty cycle of the second cyclic signal, where the duty cycle of the first cyclic signal is based on the first number of cycles, and the duty cycle of the second cyclic signal is based on the second number of cycles.

At block 408, a third number of cycles of a third cyclic signal on a third tap node is counted. The counting of block 404 can be performed by any detector circuit 202, for example. The third tap node is along the serially connected buffers 102 and can be, for example, the first tap node or second tap node.

At block 410, a frequency or a period of the third cyclic signal is determined based on the third number of cycles. The determining of block 406 can be performed by the controller 206.

While the foregoing is directed to specific examples, other and further examples may be devised without departing from the basic scope thereof, and the scope thereof is determined by the claims that follow.

What is claimed is:

1. An integrated circuit comprising:
 a ring oscillator comprising serially connected buffers, each of the buffers comprising at least two serially connected inverters comprising transistors, one or more of the transistors of each of the buffers having a different strength of another one or more of the transistors of the respective buffer;
 a first detector circuit connected to a first tap node along the serially connected buffers, the first detector circuit comprising a first counter and first logic, the first detector circuit being configured to count a first number of cycles of a reference clock that a first cyclic signal on the first tap node is either a logically high level or a logically low level; and
 a second detector circuit connected to a second tap node along the serially connected buffers, the second tap node being different from the first tap node, the second detector circuit comprising a second counter and second logic, the second detector circuit being configured to count a second number of cycles of the reference clock that a second cyclic signal on the second tap node is either a logically high level or a logically low level.

2. The integrated circuit of claim 1 further comprising a controller configured to determine a gradient between the first tap node and the second tap node based on the first number of cycles and the second number of cycles.

3. The integrated circuit of claim 2, wherein the gradient is a high period gradient, the high period gradient being a difference between a high period of the first cyclic signal and a high period of the second cyclic signal, the high period of the first cyclic signal being based on the first number of cycles, the high period of the second cyclic signal being based on the second number of cycles.

4. The integrated circuit of claim 2, wherein the gradient is a duty cycle gradient, the duty cycle gradient being a difference between a duty cycle of the first cyclic signal and a duty cycle of the second cyclic signal, the duty cycle of the first cyclic signal being based on the first number of cycles, the duty cycle of the second cyclic signal being based on the second number of cycles.

5. The integrated circuit of claim 1 further comprising a third detector circuit connected to a third tap node along the serially connected buffers, the third detector circuit comprising a third counter and third logic, the third detector circuit being configured to count a third number of cycles of a third cyclic signal on the third tap node.

6. The integrated circuit of claim 5, wherein the third detector circuit is included in the first detector circuit or the second detector circuit, the third tap node and the third cyclic signal being the first tap node or the second tap node and the first cyclic signal and the second cyclic signal, respectively.

7. The integrated circuit of claim 1, wherein each of the inverters of each of the buffers is asymmetric, transistors of the inverters that affect a rise or fall-time of a signal propagated through the respective buffer being a first group, transistors of the inverters that affect the other of the rise or fall-time of the signal propagated through the respective buffer being a second group, respective strengths of the transistors of the first group being greater than respective strengths of the transistors of the second group.

8. The integrated circuit of claim 1, wherein each of the inverters of each of the buffers is symmetric, respective strengths of the transistors of a first inverter of the inverters being greater than respective strengths of the transistors of a second inverter of the inverters.

9. A method for determining skew of an integrated circuit, the method comprising:
counting, by a first detector circuit, a first number of cycles of a reference clock that a first cyclic signal on a first tap node is either a logically high level or a logically low level, the first tap node being along serially connected buffers of a ring oscillator, each of the buffers comprising at least two serially connected inverters comprising transistors, one or more of the transistors of each of the buffers having a different strength of another one or more of the transistors of the respective buffer;
counting, by a second detector circuit, a second number of cycles of the reference clock that a second cyclic signal on a second tap node is either a logically high level or a logically low level, the second tap node being along the serially connected buffers and being different from the first tap node; and
determining, by a controller, a gradient between the first tap node and the second tap node based on the first number of cycles and the second number of cycles.

10. The method of claim 9, wherein the gradient is a high period gradient, the high period gradient being a difference between a high period of the first cyclic signal and a high period of the second cyclic signal, the high period of the first cyclic signal being based on the first number of cycles, the high period of the second cyclic signal being based on the second number of cycles.

11. The method of claim 9, wherein the gradient is a duty cycle gradient, the duty cycle gradient being a difference between a duty cycle of the first cyclic signal and a duty cycle of the second cyclic signal, the duty cycle of the first cyclic signal being based on the first number of cycles, the duty cycle of the second cyclic signal being based on the second number of cycles.

12. The method of claim 9 further comprising counting a third number of cycles of a third cyclic signal on a third tap node, the third tap node being along the serially connected buffers.

13. The method of claim 12 further comprising determining a frequency or a period of the third cyclic signal based on the third number of cycles.

14. The method of claim 9, wherein each of the inverters of each of the buffers is asymmetric, transistors of the inverters that affect a rise or fall-time of a signal propagated through the respective buffer being a first group, transistors of the inverters that affect the other of the rise or fall-time of the signal propagated through the respective buffer being a second group, respective strengths of the transistors of the first group being greater than respective strengths of the transistors of the second group.

15. The method of claim 9, wherein each of the inverters of each of the buffers is symmetric, respective strengths of the transistors of a first inverter of the inverters being greater than respective strengths of the transistors of a second inverter of the inverters.

16. An integrated circuit comprising:
a ring oscillator comprising serially connected buffers, each of the buffers comprising:
a first inverter comprising a first p-type transistor and a first n-type transistor, an input node of the first inverter being an input node of the respective buffer; and
a second inverter comprising a second p-type transistor and a second n-type transistor, an input node of the second inverter being connected to an output node of the first inverter, an output node of the second inverter being an output node of the respective buffer, a strength of at least one of the first p-type transistor, the second p-type transistor, the first n-type transistor, and the second n-type transistor being greater than a strength of another at least one of the first p-type transistor, the second p-type transistor, the first n-type transistor, and the second n-type transistor;
a first detector circuit connected to a first tap node along the serially connected buffers, the first detector circuit comprising a first counter and first logic that collectively is configured to count a first number of cycles of a reference clock that a first cyclic signal on the first tap node is either a logically high level or a logically low level; and a second detector circuit connected to a second tap node along the serially connected buffers, the second tap node being different from the first tap node, the second detector circuit comprising a second counter and second logic that collectively is configured to count a second number of cycles of the reference clock that a second cyclic signal on the second tap node is either a logically high level or a logically low level.

17. The integrated circuit of claim 16, wherein at least one of the first detector circuit and the second detector circuit further comprises a third counter and third logic that collectively is configured to count a third number of cycles of the first cyclic signal or the second cyclic signal, respectively.

18. The integrated circuit of claim 17 further comprising a controller configured to:

determine at least one of a high period gradient or a duty cycle gradient, each of the high period gradient and the duty cycle gradient being between the first tap node and the second tap node based on the first number of cycles and the second number of cycles; and determine at least one of a frequency or a period based on the third number of cycles.

19. The integrated circuit of claim 16, wherein:

respective strengths of the first p-type transistor and the first n-type transistor are imbalanced; and respective strengths of the second p-type transistor and the second n-type transistor are imbalanced.

20. The integrated circuit of claim 16, wherein:

respective strengths of the first p-type transistor and the second p-type transistor are imbalanced; and respective strengths of the first n-type transistor and the second n-type transistor are imbalanced.

* * * * *